United States Patent [19]
Stein

[11] 3,946,255
[45] Mar. 23, 1976

[54] SIGNAL GENERATOR

[75] Inventor: Jeffrey P. Stein, Hatfield, Pa.

[73] Assignee: Honeywell Inc., Minneapolis, Minn.

[22] Filed: Apr. 25, 1974

[21] Appl. No.: 463,896

[52] U.S. Cl. ......... 307/269; 307/221 R; 307/223 R; 328/37; 328/62
[51] Int. Cl.² ........................................ H03K 5/15
[58] Field of Search ........ 307/221 R, 221 C, 223 R, 307/223 C, 269; 328/62, 63, 37

[56] References Cited
UNITED STATES PATENTS 3,517,219   6/1970   Okubo ........................... 307/223 C
3,783,306   1/1974   Hoffmann ....................... 307/221 C
3,786,281   1/1974   Koike et al. ....................... 328/37 X Primary Examiner—John Zazworsky
Attorney, Agent, or Firm—Arthur H. Swanson; Lockwood D. Burton; Mitchell J. Halista

[57] ABSTRACT

A signal generator uses a shift register connected in a feedback loop with selectively operable gates between signal storage elements of the shift register. Non-overlapping clock signals are used to operate the gates to shift digital bits within the shift register and to concurrently operate gates connected to outputs of the shift register to define non-overlapping signal generator output signals.

8 Claims, 5 Drawing Figures

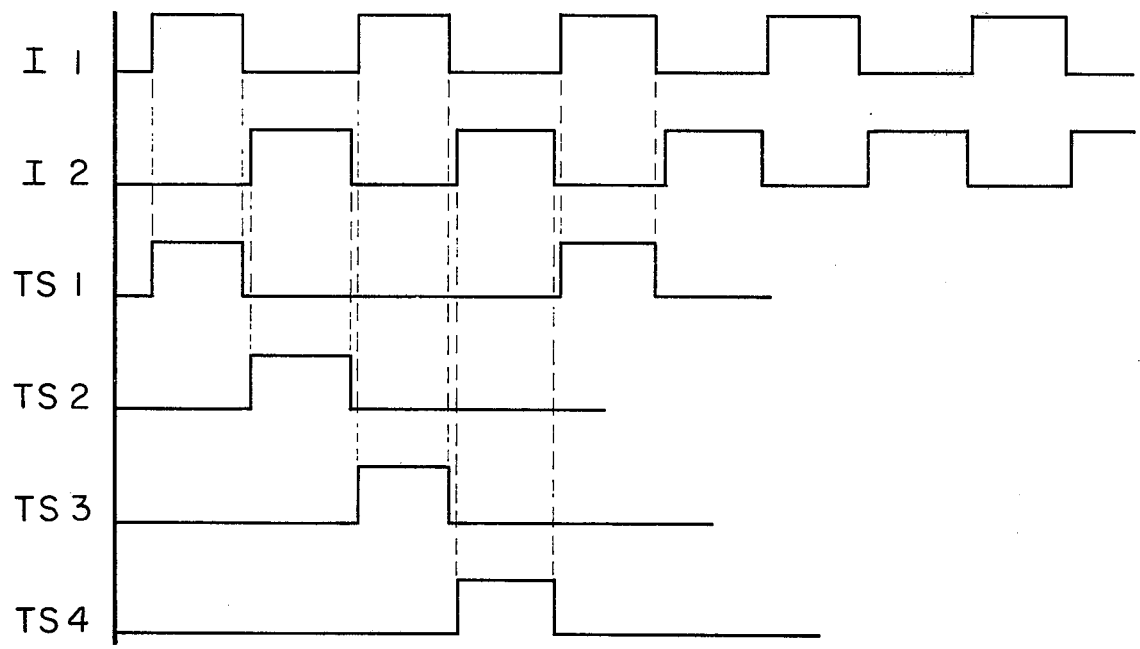
F I G. I
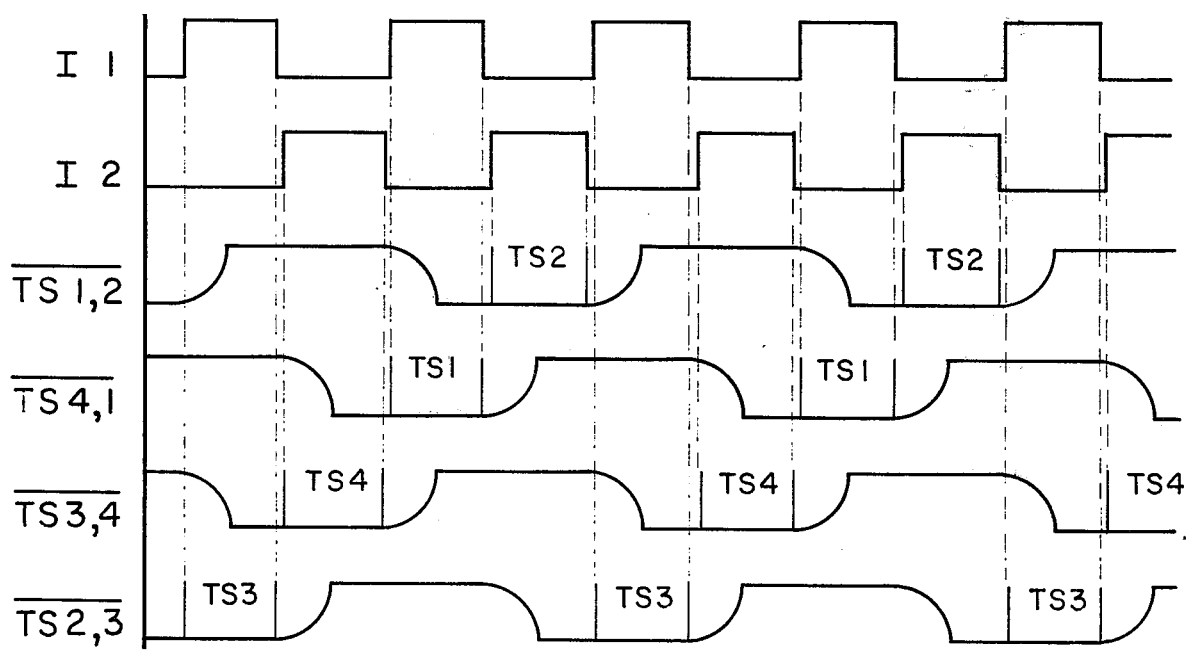
F I G. 3

SIGNAL GENERATOR

BACKGROUND OF THE INVENTION

1. FIELD OF THE INVENTION

The present invention relates to signal generators. More specifically, the present invention is directed to a signal generator for producing a plurality of time-spaced output signals.

2. DESCRIPTION OF THE PRIOR ART

Digital data handling machines starting with those of reasonable complexity operate on the basis of accurately predetermined timing periods, or state times. In such machines, a sequence of state times provides a control of a central processing unit, hereinafter referred to as a CPU, for controlling registers, adders, etc. to effect an overall control of the execution of CPU instructions. Each state time may be divided into a plurality of time slots which are used to gate information into and out of the functional elements of the CPU. Each of these time slots must be characterized by an accurate timing pulse having fast rise and fall times while the pulses representing a series of time slots must be applied in a non-overlapping configuration in order to prevent erroneous operation of the functional CPU elements to which they are applied.

SUMMARY OF THE INVENTION

An object of the present invention is to provide an improved signal generator for providing non-overlapping timing pulses having fast rise and fall times.

In accomplishing this and other objects, there has been provided, in accordance with the present invention, a signal generator using a shift register having a plurality of signal storage stages, selectively operable gates between the storage stages and a feedback loop around the shift register. The gates in the shift register are operated by non-overlapping clock signals while output signals from the shift register are taken from the signal storage stages and are modified by gates circuits concurrently operated by the non-overlapping clock signals.

BRIEF DESCRIPTION OF THE DRAWINGS

A better understanding of the present invention may be had when the following detailed description is read in connection with the accompanying drawings, in which, FIG. 1 is a waveshape timing diagram showing the relationships of the signal generated by the signal generator of the present invention, FIG. 3 is a timing diagram showing the relationships of the signals occurring in the circuit illustrated in FIG. 2.

DESCRIPTION OF THE PREFERRED EMBODIMENT DETAILED DESCRIPTION

The phase relationship of the output signals TS1, TS2, TS3 and TS4 from the signal generator of the present invention to the CPU system clock signals I1 and I2 is shown in FIG. 1 by the dotted vertical lines. As shown in FIG. 1, the clock signal I1 is related to the output pulses identified as TS1 and TS3 while the clock signal I2 is related to the output pulses identified as TS2 and TS4. Thus, the output pulses TS2 to TS4 are interlaced while being alternately generated by the system clock signals I1 and I2, i.e., a TS1 output pulse is followed by a TS2 output pulse although these pulses are generated by different ones of the CPU system clock signals I1 and I2. The output signals TS1 to TS4 are generated in synchronism with the CPU system clock signals I1 and I2 to insure that these output signals occur only at the time of a desired time slot. The frequency of generation of the output signals TS1 to TS4 is controlled at a frequency suitable for use with the data handling operations in the CPU while the time, or phase, accuracy of the output signals TS1 and TS4 is controlled to maintain accuracy in the signal handling operations of the CPU.

Figure 2:
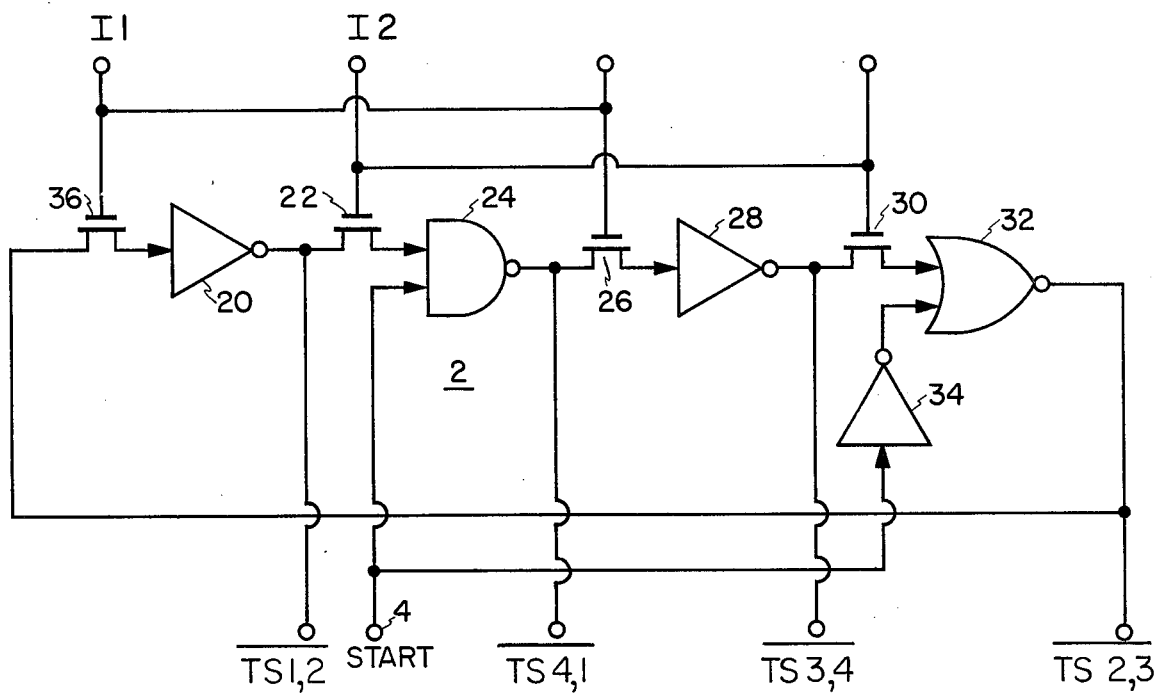
FIG. 2 is a schematic illustration of a basic signal generating circuit suitable for use with the present invention to generate a sequence of clock signals.

The signal generator circuit embodying I2. present invention for producing the time slot pulses TS1 to TS4 includes a two-bit MOS shift register configuration which is clocked by the CPU system clock signals I1 and I. This shift register circuit 2 is shown in FIG. 2 with the CPU system clock signals I1 and I2 applied thereto. The shift register 2 includes a first logical inverter 20 having an output connected through a first FET 22 to a first input of an NAND gate 24. The second input of the NAND gate 24 is connected to a Start input terminal. The output of the NAND gate 24 is connected through a second FET 26 to an input of a second logical inverter 28. The output of the second inverter 28 is connected through a third FET 30 to a first input of a NOR gate 32. A second input of the NOR gate 32 is connected to the Start input terminal through a third logical inverter 34. The output of the NOR gate 32 is connected to the input of the first inverter 20 through a fourth FET 36 to form a feedback loop on the shift register 2. The output signals from the shift register 2 are taken from the output of the first inverter 20, the NAND gate 24, the second inverter 28 and the NOR gate 32. The system clock signals I1 and I2 are applied to the gate electrodes of the FET's 22, 26, 30 and 36 in an alternate fashion, i.e., the first clock signal I1 is applied to the second and fourth FET's 26 and 36 while the second clock signal I2 is applied to the first and third FET's 22 and 30. The shift register 2 is initialized, or preset, by a Start, i.e., a logical low signal, pulse applied to a Start input terminal 4 and is subsequently operative to shift a 1,0 digital pattern continually around in a loop including the shift register 2 as is shown in FIG. 2.

Specifically, the Start signal is effective to apply a high level signal to the input of the NOR gate 32 through the third inverter 34. This high level input signal to the NOR gate 32 produces a low level output signal which, in turn, is fed back to the input of the first inverter 20 when the fourth FET 36 is energized by the first clock signal I1. It should be noted that the gates and inverters have signal storage capabilities at their inputs by capacitive effects which store the input signals and prevent instantaneous changes in their output signals when input signals thereto are first applied and when the input signals are terminated.

Concurrently, the low level Start signal is applied to the input of the NAND gate 24 where it is effective to produce a high level output signal, i.e., a logical "1", at the output of the NAND gate 24. That high level signal is applied to the inverter 28 through the second FET 26 which is also energized by the first clock signal I1. The high level input to the inverter 28 produces a low level output signal from the inverter 28 which signal is retained for a period of time by the aforesaid capacitive effects. During the time of the second clock signal I2, the low level signal from the inverter 28 is applied to the input of the NOR gate 32 while the high level signal at the output of the first inverter 20 is applied through the first FET 22 to the input of the NAND gate 24. The subsequent operation of the shift register 2 is a continuation of the aforesaid operation with a shifting of high and low levels, i.e., logical "1"'s and "0"'s. The output signals from the shift register 2 are shown in the FIG. 2 as logical low signals, e.g., $\overline{TS1, 2}$. These output signals define the time of the desired time slot signals TS1 to TS4 during the low level periods, i.e., logical "0", which are repeated on every other one of the system clock pulse I1 and I2. A waveshape diagram illustrating the operation of the shift register shown in FIG. 2 is illustrated in FIG. 3.

Figure 4:
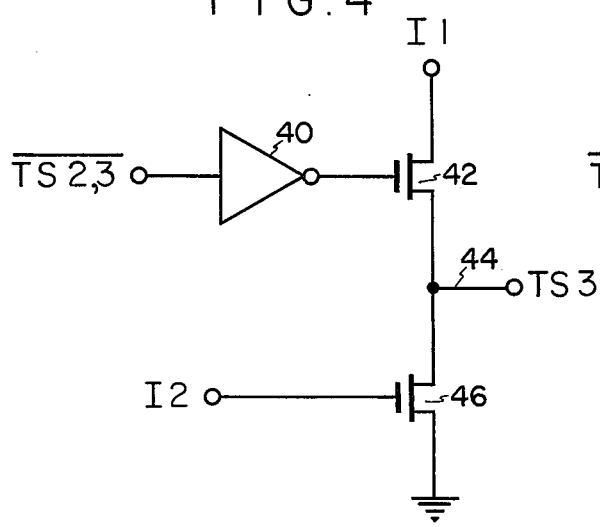
FIG. 4 is a schematic illustration of a circuit suitable for use with the basic signal generating circuit shown in FIG. 2 and, FIG. 5 is a schematic illustration of another circuit suitable for use with the basic signal generating circuit shown in FIG. 2.
Figure 5:
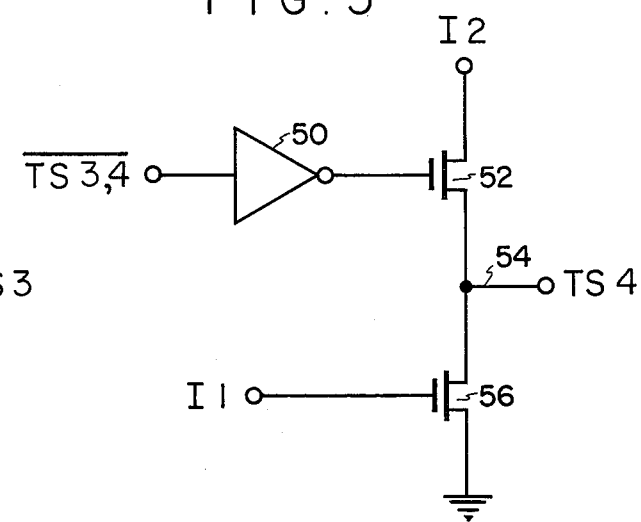

In order to extract the time slot signals TS1 to TS4 from the output signals of the shift register 2 shown in FIG. 2, the circuits shown in FIGS. 4 and 5 are connected to respective ones of the output circuits of the shift register of FIG. 2 to provide a time slot signal from each of the logical "0" periods of the output signals from the shift register of FIG. 2. The resultant time slot signals TS1 to TS4 are superimposed on the output signal waveshapes from the shift register 2 of FIG. 2 as illustrated in FIG. 3. It should be noted from the waveshape diagrams of FIG. 3 that the resultant time slot signals TS1 to TS4 are non-overlapping as a result of the non-overlapping nature of the system clock signals I1 and I2. The operation of the circuit shown in FIGS. 4 and 5 is a gating operation wherein the system clock signals I1 and I2 are used to generate their respective time slot signals. Briefly, when the system clock signal for a corresponding time slot output signal and an output signal from the shift register 2 shown in FIG. 2 is applied to the circuits of FIGS. 4 and 5, an output signal appears on an output line from the circuits of FIGS. 4 and 5 as a time slot signal.

For example, using the circuit illustrated in FIG. 4, when the output signal $\overline{TS2, 3}$ from the shift register 2 is applied to the input of a logical inverter 40, it is effective to produce an output signal from the logical inverter 40 which is applied to the gate of a first FET 42. When the input signal to the logical inverter 40 is a logical low, which is the output signal from the shift register 2 that is utilized, as previously discussed, the input signal to the FET 42 is a logical high. This high level signal places the MOS transistor 42 in a conducting state. The clock signal I1 is applied concurrently to energize the first FET 42 whereby the conducting state of the FET 42 applies the system clock I1 to the output line 44 as the time slot signal TS3. The other system clock signal I2 is applied to the gate electrode of a second FET transistor 46 connected in series with the first transistor 42 with the output line 44 being connected therebetween. Since the first clock signal I2 is at a logical low level when the first clock signal I1 is at a logical high level, the second transistor 46 is in an "off" state during the time of the high output signal from the inverter 40. Subsequently, when the second clock signal I2 is at a high level, the first clock signal I1 is at a low level due to the non-overlapping nature of the system clock signals I1 and I2. Accordingly, even if the high level output signal from the inverter 40 should be present for a time following the change of a second clock signal I2 to a high level signal, the first transistor 42 is de-energized by the absence of the high level signal from the first clock signal I1. As a result, the high level output signal TS3 is terminated, and the output line 44 is connected to a ground terminal through the second transistor 46. The circuit shown in FIG. 5 would provide a similar operation to convert the register output signal $\overline{TS3, 4}$ to a time slot signal TS4, i.e., the circuit of FIG. 5 would be used to provide the even numbered time slot signals TS2 and TS4. It should be noted that there is little delay between the clock signals I1 and I2 and the time slot signals due to the direct drive of FET devices so that the time slot signals rapidly follow the clock signals with fast rise and fall times.

Accordingly, it may be seen that there has been provided, in accordance with the present invention, a signal generator for generating timing pulses having accurate rise and fall times and a non-overlapping pulse configuration to define separate time slots.

The embodiment of the invention in which an exclusive property or privilege is claimed are defined as follows:

1. A signal generator comprising:
   a shift register having a plurality of serially connected signal storage elements and having a feedback loop for applying a register output signal to an input of said register, said register including a signal gate connected between each of said signal storage elements in the serial array,
   a first clock signal generating means,
   a second clock signal generating means, said first and second clock signals having a non-overlapping phase relationship,
   circuit means applying said first and second clock signals to respective ones of said signal gates connected between each of said signal storage elements in said register to alternately operate said register by said first and second clock signals, and
   output means connected to predetermined ones of said signal storage elements and to said first and second clock signals to produce an output signal from said predetermined ones of said signal storage elements in response to a concurrent presence of an output signal from a respective one of said signal storage elements and a respective one of said first and second clock signals.

2. A signal generator as set forth in claim 1 wherein said output means include a plurality of signal gates each having an energizing signal applied thereto by a respective one of said first and second clock signal generating means and an input signal from a respective one of said signal storage elements.

3. A signal generator as set forth in claim 2 wherein said signal storage elements in said register each include signal level inverting means.

4. A signal generator as set forth in claim 3 wherein said register includes a start means arranged to apply an input signal to said register to predetermined ones of said signal storage elements.

5. A signal generator as set forth in claim 1 wherein said output means includes a plurality of signal gates each having an energizing signal applied thereto by a respective one of said first and second clock signals and an input signal from a respective one of said signal storage elements.

6. A signal generator as set forth in claim 5 wherein each of said output signals from said predetermined ones of said signal storage elements overlap at least one other one of said output signals from said predetermined ones of said signal storage elements and each of said signal gates is effective to select a portion of a respective one of said output signals from said predetermined ones of said signal storage elements in response to said first and second clock signals to produce a corresponding output signal with the output signals from said signal gates being mutually non-overlapping.

7. A signal generator as set forth in claim 6 wherein each of said signal gates includes a first gate means, a second gate means, first circuit means connecting said first and second gate means in series between a respective one of said first and second clock signal generating means and a common return path, output terminal means connected between said first and second gate means, second circuit means arranged to applied a corresponding one said output signals from said predetermined ones of said signal storage elements to said first gate means, third circuit means arranged to apply to said second gate means the other one of said first and second clock signals from that applied by said first circuit means.

8. A signal generator as set forth in claim 7 wherein said register includes a start means arranged to apply an input signal to said register to predetermined ones of said signal storage elements.

* * * * *